United States Patent
Uzelac

(10) Patent No.: US 6,650,170 B1
(45) Date of Patent: Nov. 18, 2003

(54) TEMPERATURE COMPENSATED OUTPUT DRIVER

(75) Inventor: Lawrence S. Uzelac, Auburn, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/259,080

(22) Filed: Sep. 27, 2002

(51) Int. Cl.[7] .................................................. H01L 35/00

(52) U.S. Cl. ........................................ 327/513; 327/112

(58) Field of Search ................................ 327/108, 111, 327/112, 512, 513; 326/83, 85, 86, 87

(56) References Cited

U.S. PATENT DOCUMENTS

| 4,717,836 | A | * | 1/1988 | Doyle | 327/512 |
| 5,739,707 | A | * | 4/1998 | Barraclough | 327/112 |
| 5,801,558 | A | * | 9/1998 | Freyman et al. | 327/112 |
| 6,118,327 | A | * | 9/2000 | Watarai | 327/513 |
| 6,483,354 | B1 | * | 11/2002 | Gasparik | 327/112 |
| 6,512,412 | B2 | * | 1/2003 | Casper | 327/538 |

* cited by examiner

*Primary Examiner*—Toan Tran
(74) *Attorney, Agent, or Firm*—Buckley, Maschoff, Talwalkar & Allison LLC

(57) ABSTRACT

According to some embodiments, a drive circuit provides an output resistance substantially stable despite variations in operating temperature.

22 Claims, 4 Drawing Sheets

TEMPERATURE COMPENSATED OUTPUT DRIVER

BACKGROUND

A circuit may be used to act as an output driver to provide output signals from a device to a load. The output driver may be configured to provide a desired output signal (e.g., for digital devices, the output driver may be used to provide desired "high" and "low" output signal levels). Often it is desirable to have the impedance of the output driver to match the impedance of the driven load.

The accuracy of existing output drivers can be affected by temperature variations. For example, an output driver may be formed from a switch (such as a transistor) and one or more resistors. The effective resistance of each of these devices can vary with fluctuations in temperature. For example, the effective drive state resistance of an output driver typically increases with increases in temperature. As the temperature varies, and the effective impedance of the output driver increases, the output signal integrity is reduced. An output driver which is designed to produce a desired output signal may have, for example, an effective resistance of 50 ohms. This effective resistance can rise 1–10 ohms as the operating temperature increases, resulting in an undesirable variation in the output impedance produced by the driver. The resulting impedance mismatches between the output driver and the driven load results in undesirable signal variations.

DETAILED DESCRIPTION

Figure 1C:
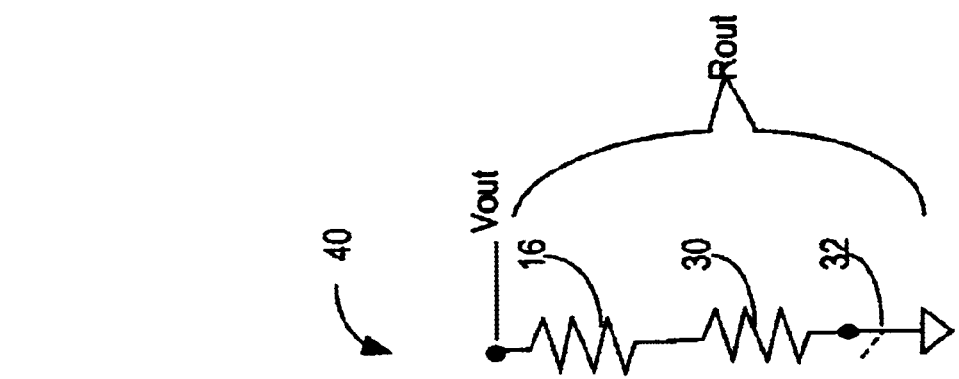
FIG. 1C is a portion of the simplified model of FIG. 1B.

Some embodiments are associated with circuits that generate an output voltage having a reduced sensitivity to variations in temperature. FIG. 1A is a block diagram of a circuit 10 according to some embodiments. As depicted, circuit 10 is operable to switch between a first output voltage (e.g., $V_{cc}$ or a supply voltage) and a second output voltage (e.g., ground or some other reference voltage), and includes a p-channel transistor 12 having a source coupled to $V_{cc}$ and a drain coupled to a polysilicon resistor 14. Polysilicon resistor 14 is coupled to an output signal line (e.g., for providing an output signal $V_{out}$ to a load) and to a polysilicon resistor 16. Polysilicon resistor 16 is coupled to the drain of an n-channel transistor 18. The source of transistor 18 is coupled to ground. A particular output signal presented at $V_{out}$ is selected by operating either transistor 12 or transistor 18 by presenting a signal (S1 or S2) at the gate of either transistor 12 or transistor 18.

Polysilicon resistors 14 and 16 are fabricated to have a negative resistance versus temperature behavior (e.g., as an operating temperature increases, the resistance of the polysilicon resistors tends to decrease). For example, polysilicon resistors 14, 16 may be fabricated by selectively blocking the formation of a silicide metal (e.g., such as cobalt di-silicide or other silicides of metals such as titanium or the like) over the polysilicon layer area occupied by the polysilicon resistors 14, 16. For example, when fabricating the desired polisilicon resistors 14, 16, an oxide area over the resistor area is left intact when a metal oxide is sputtered. The desired polysilicon resistors 14, 16 are thus formed having a desired amount of polysilicon overlaid with a layer of oxide. In some embodiments, the oxide layer may be etched or otherwise removed. In some embodiments, the oxide layer may be retained. The polysilicon may be doped (e.g., using boron or the like) as is known in the art.

Polysilicon resistors formed in this fashion exhibit negative resistance versus temperature behavior, and are described in "The Design of Thin-Film Polysilicon Resistors for Analog IC Applications", Lane et al, IEEE Transactions on Electron Devices, Vol. 36, No. 4, April 1989 (describing the strong negative-temperature coefficient associated with some types of polysilicon films).

When transistors 12, 18 are biased in the linear region of operation, they provide a resistance. For example, when a signal is presented at the gate of transistor 12, output signal line is pulled to $V_{cc}$ via a circuit path that includes two resistances: the resistance of transistor 12 and the resistance of polysilicon resistor 14. Embodiments select the resistances of transistors 12, 18 and the resistances of polysilicon resistors 14, 16 to balance the positive resistance increase over temperature of the transistors with a negative resistance response of the polysilicon resistors to minimize the effect of temperature variations on the output signal. Some embodiments select the resistances of transistor 12, 18 and the resistances of polysilicon resistors 14, 16 to provide a relatively constant output resistance over the operating temperature and bias conditions of the circuit.

Figure 1B:
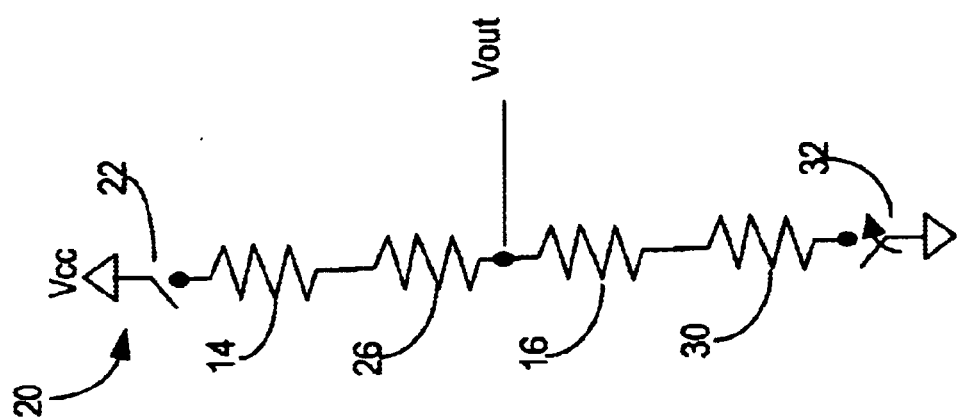
FIG. 1B is a block diagram of a simplified model of the circuit of FIG. 1A.
Figure 1A:
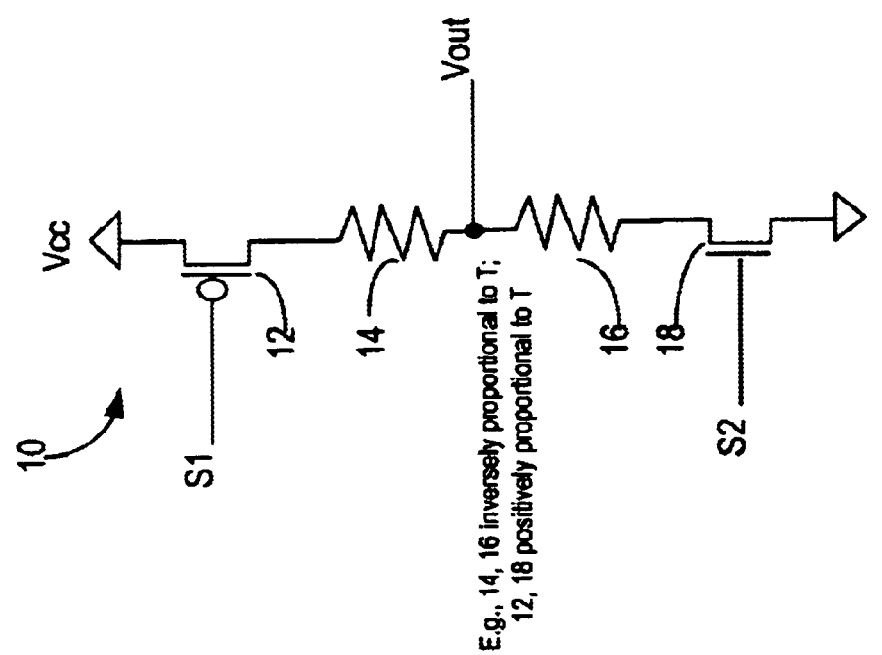
FIG. 1A is a block diagram of a circuit according to some embodiments.

A representation 20 of circuit 10 is depicted in FIG. 1B. The representation 20 shows that, effectively, circuit 10 provides a switch 22 which can be selectively operated to pull the output signal line to a first voltage $V_{cc}$ (e.g., to provide a "drive high" portion of circuit 10). Transistor 12 provides a resistor 24 which operates in series with polysilicon resistor 14. A second switch 32 can be selectively operated to pull the output signal line to a second voltage (e.g., ground or $V_{ss}$ to provide a "drive low" portion of circuit 10). Transistor 18 provides a resistor 30 which operates in series with polysilicon resistor 16.

A further representation 40 is provided in FIG. 1C which models the "drive low" portion of circuit 10. When n-channel transistor 18 is biased in the linear region of operation (e.g., switch 32 is operated), $V_{out}$ is pulled low (e.g., to ground or $V_{ss}$) through an effective resistance ($R_{out}$) comprised of the resistance 30 of the n-channel transistor and the resistance of polysilicon resistor 16. Embodiments provide an $R_{out}$ which remains relatively constant over variations in operating temperature and bias conditions of the circuit.

Selection of the resistance values of the transistor resistance and the polysilicon resistor will now be described by reference to FIG. 1C. The resistence of the n-channel transistor (represented by resistor 30) will be referred to as $R_{nmos}$. The resistance of polysilicon resistor 16 will be referred to as $R_{poly}$, and the effective output resistance will be referred to as $R_{out}$. The following equations (1)–(5) may be used to identify a desired relationship between $R_{nmos}$ and $R_{poly}$ to provide a desired $R_{out}$.

$$R_{out} = R_{poly}(T) + R_{nmos}(T) = Const. \text{ with} \quad (1)$$

$$R_{poly}(T) = R_{poly}(25° \text{ C.}) * [1 + (T - 25) * TC_{poly}] \text{ and} \quad (2)$$

-continued $$R_{nmos}(T) = \frac{1}{g_m(T)} = \frac{1}{\frac{\mu_c(T)C_{ox}Z}{2L}[V_{gs} - V_t]} \quad (3)$$

$$R_{nmos}(T) = R_{nmos}(25° \text{ C.}) * [1 + (T - 25) * TC_{nmos}] \quad (4)$$

$$R_{nmos} = R_{poly}\left(\frac{-TC_{poly}}{TC_{mos}}\right) \quad (5)$$

In the equations, $R_{poly}(25° \text{ C.})$ is the room-temperature value of the polysilicon resistor (item 16 of FIGS. 1A–C). $TC_{poly}$ is the temperature coefficient of boron doped polysilicon (and may be, for example, approximately −500 ppm, although those skilled in the art will recognize that other coefficients may be provided by other fabrication techniques). The value $g_m(T)$ represents the temperature-dependent transconductance of the n-channel transistor (item 18 of FIG. 1A, and represented by switch 32 and resistance 30 of FIG. 1C), and $\mu_c(T)$ represents the temperature-dependent carrier mobility of the n-channel transistor. Similar to the polysilicon resistor, in the linear range of operation, the equivalent resistance of the n-channel transistor (Rnmos) is linearly proportional to the operating temperature. The temperature dependance of the equivalent resistance ($R_{nmos}$) of the transistor can therefore be assigned the temperature coefficient $R_{nmos}(T)$ as shown in Equation (4). In Equation (4) the value $TC_{nmos}$ represents the empirically determined temperature coefficient of the n-channel transistor in the linear region of operation (e.g., typically approximately +3000 ppm).

Embodiments allow temperature compensation of a drive circuit such as the drive low portion of the circuit of FIG. 1 by setting the values of $R_{poly}$ and $R_{nmos}$ in such a manner that the positive temperature dependance of the transistor resistance ($R_{nmos}$) is offset by the negative temperature dependence of the polysilicon resistor ($R_{poly}$). By combining Equations (1), (2) and (4), the relationship between $R_{poly}$ and $R_{nmos}$ is established and represented in Equation (5).

As an example, if the effective output resistance ($R_{out}$) of a drive low portion of an output drive circuit is desired to be 50 ohms, and if $TC_{poly}=-500$ ppm and $TC_{nmos}=+3000$ ppm, a combination of $R_{poly}=42.9$ ohms and $R_{nmos}=7.1$ ohms will provide the desired $R_{out}$ in a manner which will remain substantially constant despite variations in temperature. Those skilled in the art will appreciate that these values are provided for illustrative purposes only; different values and results may be achieved using different fabrication processes.

Further, by selecting a lower resistance value for the n-channel transistor, the n-channel transistor will remain in the linear region of operation as desired (e.g., due to the source-drain resistance being a minor part of the total resistance $R_{out}$). Similar calculations and design considerations may be applied to identify a desirable combination of resistances for the "drive high" portion of circuit 10 of FIG. 1A. Further, although embodiments may be utilized to attain an effective output resistance ($R_{out}$) which is substantially resistant to temperature variations, some embodiments may be utilized to select resistances which balance other design considerations. For example, embodiments may be utilized to select from among several transistor resistances to provide a practical design which minimizes the effect of temperature on the circuit.

Figure 2:
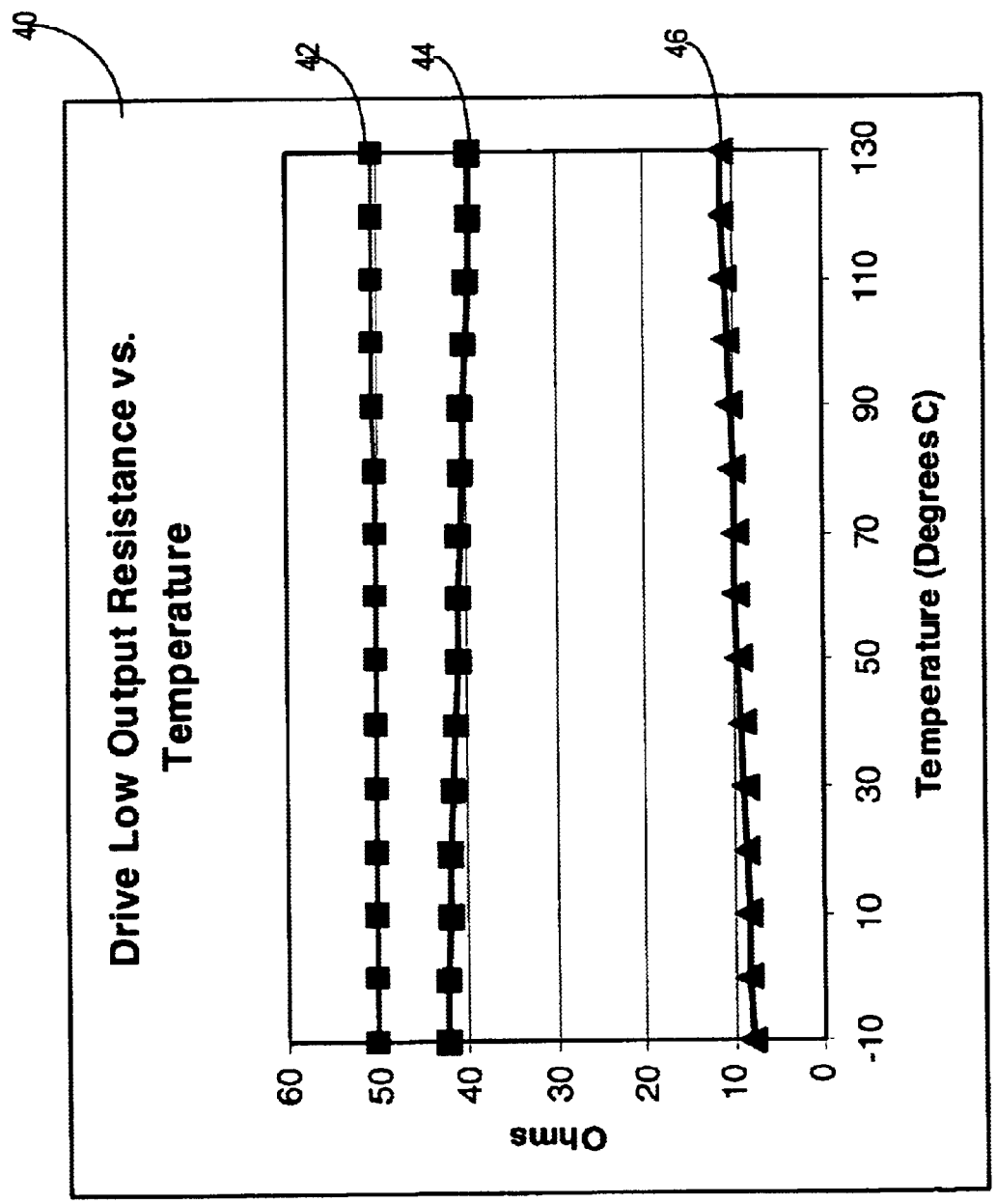
FIG. 2 illustrates a relationship between temperature and output resistance of a portion of the circuit of FIG. 1A.

Reference is now made to FIG. 2 where a diagram 40 is presented which graphically represents the temperature dependence of the "drive low" portion of circuit 10 of FIG. 1A. The data depicted in diagram 40 is based on a silicon device circuit simulation in which the desired Rout is 50 ohms and in which $R_{poly}$ is 41.5 ohms (at room temperature). As depicted, for operating temperatures ranging from −10° C. to +130° C., the value of $R_{nmos}$ (depicted as item 46 in FIG. 2) varied from 7.798 ohms to 11.11 ohms and the value of $R_{poly}$ (depicted as item 44 in FIG. 2) varied from 42.03 ohms to 39.32 ohms. The effective output resistance $R_{out}$ (whose values are depicted as item 42 of FIG. 2) is relatively insensitive to variations in operating temperature, ranging from 50.02 ohms to 50.43 ohms.

Figure 3:
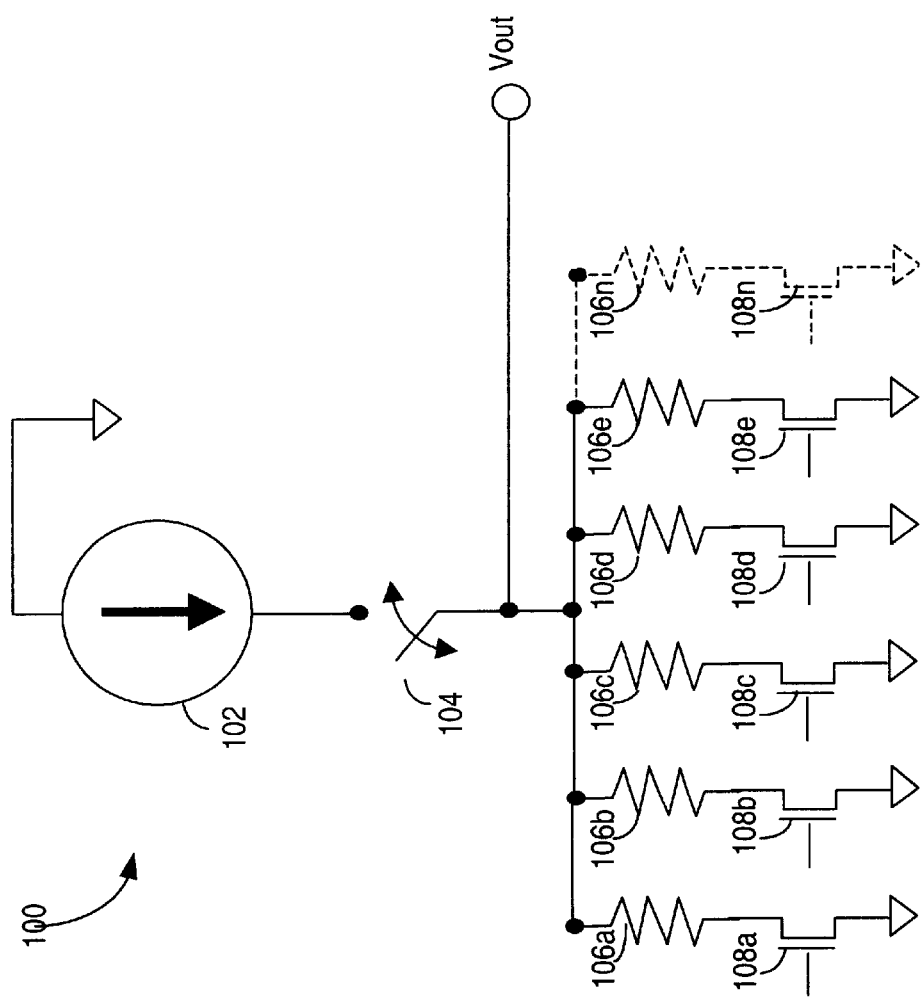
FIG. 3 is a block diagram of a further circuit according to some embodiments.

Embodiments may be utilized to implement other configurations of drive circuits. For example, referring now to FIG. 3, a further circuit 100 is depicted. Circuit 100 is a current mode output driver which utilizes embodiments to selectively switch in resistance values to create a desired effective resistance (e.g., to match an impedance of a load device receiving a signal $V_{out}$). Circuit 100 includes a current source 102 providing a known current through a switching device 104 to one or more circuit banks including a resistor 106 in series with a transistor 108.

One or more circuit banks can be selectively switched in by presenting a signal on a gate of individual transistors 108. Each circuit bank is configured using a polysilicon resistor 106 (having negative resistance versus temperature behavior as described above) in series with a transistor 108 having a positive resistance versus temperature behavior. The effective resistance provided by each circuit bank may be selected as described above to provide an effective resistance that is relatively constant over the operating conditions and bias conditions of the circuit. In operation, one or more circuit banks may be selected to provide a desired total effective resistance which is relatively constant despite temperature fluctuations. As an example, a signal may be applied to a gate of transistor 108a and transistor 108b (but not to a gate of transistors 108c–n), causing the output signal $V_{out}$ to be driven "low" with an effective output resistance comprised of the resistance of polysilicon resistors 106a, 106b and the resistance of transistors 108a, 108b. The effective output resistance is substantially constant despite the fluctuations in temperature, allowing circuit 100 to produce a consistent and well-formed output signal.

Figure 4:
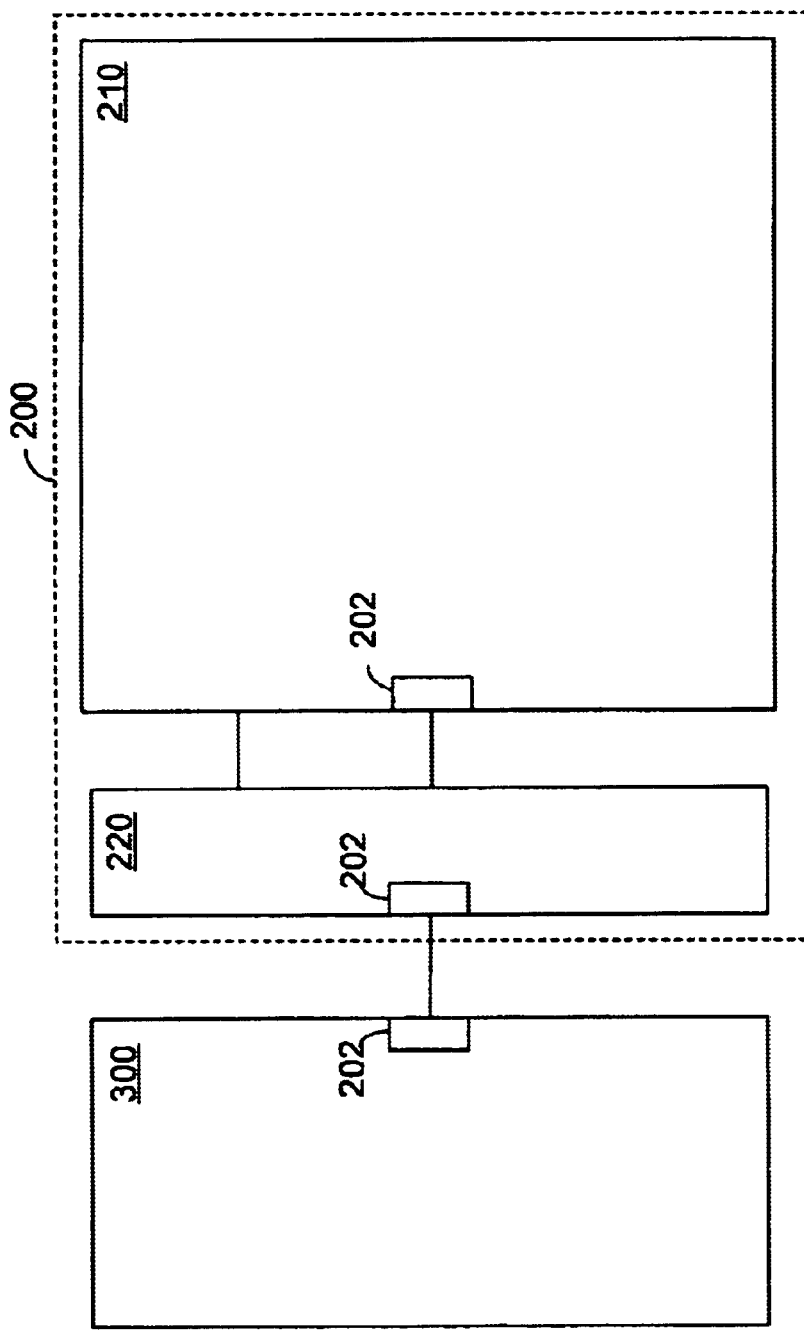
FIG. 4 is a block diagram of a system utilizing a circuit of FIG. 1.

Reference is now made to FIG. 4, where an integrated circuit 200 is depicted which employs an output driver 202 configured pursuant to embodiments in order to drive a load device 300. For example, output driver 202 may be configured as described above in conjunction with FIG. 1 to provide a consistent output signal despite fluctuations in operating temperature. Integrated circuit 200 may be provided with a number of output drivers 202 to provide a number of outputs which are relatively stable over temperature variations.

Reference is now made to FIG. 4, where a computer system 200 is depicted which employs an output driver 202 configured pursuant to embodiments in order to drive a load device 300. For example, as depicted computer system 200 includes microprocessor 210, which includes an instance of an output driver 202 such as the output driver described in conjunction with FIG. 1. Computer system 200 also includes memory controller/chipset 220 coupled to one or more I/O pins of microprocessor 200 and to memory 300. As shown, memory controller 220 and memory 200 each include at least one instance of output driver 202. Each of the illustrated instances of output driver 202 is adapted to provide output signals which are relatively stable over temperature variations. Embodiments may provide a computer system 200 in which output driver 202 is provided in one or more components of the computer system.

Memory 300 may include any memory adapted to store data. Examples of such a memory include, but are not limited to, a hard drive, Dynamic Random Access Memory, Static Random Access Memory, Read-Only Memory, and Non-Volatile Random Access Memory. Moreover, microprocessor 210 may comprise any chip or processor including but not limited to a graphics processor, a digital signal processor, and a sound processor.

Thus, embodiments may substantially reduce the effects of temperature variations in the performance of output drivers as compared to traditional circuits. The several embodiments described herein are solely for the purpose of illustration. Persons skilled in the art will recognize from this description other embodiments may be practiced with modifications and alterations limited only by the claims.

What is claimed is:

1. A circuit, comprising:
   a transistor having a first resistance at a first temperature, said first resistance increasing as said temperature increases; and
   a polysilicon resistor, coupled to a drain of said transistor and to an output voltage line, said polysilicon resistor having a second resistance at said first temperature, said second resistance decreasing as said temperature increases.

2. The circuit of claim 1, wherein said first and second resistances are selected to create an output resistance which is substantially stable over variations in said temperature.

3. The circuit of claim 1, wherein said transistor has a temperature coefficient (TC1) and said resistor has a temperature coefficient (TC2), wherein said first resistance is selected to be approximately equal to said second resistance multiplied by a factor of (−TC2/TC1).

4. The circuit of claim 1, wherein said transistor is a p-channel metal oxide semiconductor (MOS) transistor having a gate coupled to an input signal line and a source coupled to a reference voltage.

5. The circuit of claim 4, wherein a signal having a predetermined signal level on said input signal line causes said output voltage line to switch to a drive high state.

6. The circuit of claim 1, wherein said transistor is an n-channel metal oxide semiconductor (MOS) transistor having a gate coupled to an input signal line and a source coupled to a ground.

7. The circuit of claim 6, wherein a signal having a predetermined signal level on said input signal line causes said output voltage to switch to a drive low state.

8. The circuit of claim 1, wherein said polysilicon resistor is formed by selectively blocking a deposition of a silicide metal over a substrate area containing said polysilicon resistor.

9. The circuit of claim 1, wherein said transistor and said polysilicon resistor comprise a first circuit leg, said circuit further including at least a second circuit leg, wherein an output resistance of said circuit is controlled by selectively coupling said first and at least second legs.

10. A circuit, comprising:
    a p-channel transistor having a gate coupled to a first signal line, a source coupled to a first voltage source, and a drain coupled to a polysilicon resistor;
    said polysilicon resistor coupled to an output signal line and to a second polysilicon resistor, said first and second polysilicon resistors formed to each have a resistance which decreases as an operating temperature of said circuit increases;
    an n-channel transistor having a drain coupled to said second polysilicon resistor, a source coupled to a second voltage source, and a gate coupled to a second signal line; and
    wherein a signal on said first signal line causes said output signal line to be pulled to a potential of said first voltage source and a signal on said second signal line causes said output signal line to be pulled to a potential of said second voltage source.

11. The circuit of claim 10, wherein a resistance of said p-channel transistor and said polysilicon resistor are selected to provide a substantially stable output resistance over a range of temperatures.

12. The circuit of claim 10, wherein a resistance of said n-channel transistor and said second polysilicon resistor are selected to provide a substantially stable output resistance over a range of temperatures.

13. The circuit of claim 10, wherein a resistance of said p-channel transistor is selected to be smaller than a resistance of said polysilicon resistor.

14. A method for operating a circuit, comprising:
    biasing a transistor; and
    coupling an output line to a first voltage source through a first resistance provided by said transistor and a second resistance provided by a polysilicon resistor, said first resistance selected to increase as a temperature increases and said second resistance selected to decrease as said temperature increases.

15. The method for operating a circuit of claim 14, wherein said first and second resistances are selected to provide a total resistance which remains substantially stable over variations in said temperature.

16. A method, comprising:
    generating a current using a current source; and
    generating an output signal having a desired magnitude by driving said current over an effective resistance, said effective resistance created by selectively switching at least one leg of a circuit, each said leg having a transistor coupled in series to a polysilicon resistor, said transistor having a resistance which increases as a temperature increases, said polysilicon resistor having a resistance which decreases as said temperature increases.

17. The method of claim 16, wherein said effective resistance is substantially stable over variations in said temperature.

18. A circuit, comprising:
    a switching device, coupled to a first voltage source, said switching device having a resistance;
    a resistor, coupled between said switching device and an output signal line, said resistor and said resistance selected to provide an output resistance that remains substantially stable over variations in an operating temperature of said circuit when said output signal line is coupled to said first voltage source.

19. The circuit of claim 18, wherein said resistance of said switching device is selected to be smaller than a resistance of said resistor.

20. The circuit of claim 18, wherein said resistor is a polysilicon resistor formed to have a resistance that decreases as said operating temperature increases.

21. A system, comprising:
    a dynamic random access memory to store data from a device, said device comprising at least a first output driver, coupled to provide an output signal to a load device, said at least first output driver having at least a first transistor having a first resistance at a first temperature, and a resistor having a second resistance at said first temperature, said transistor and said resistor selected to have a total resistance which is substantially stable over variations in said temperature.

22. The system of claim 21, wherein said resistor is a polysilicon resistor formed with substantially no silicide metal over a substrate area containing said polysilicon resistor.

* * * * *